(12) United States Patent
Cho et al.

(10) Patent No.: US 10,074,597 B2
(45) Date of Patent: Sep. 11, 2018

(54) INTERDIGIT DEVICE ON LEADFRAME FOR EVENLY DISTRIBUTED CURRENT FLOW

(71) Applicant: Infineon Technologies Americas Corp., El Segundo, CA (US)

(72) Inventors: Eung San Cho, Torrance, CA (US);
Oliver Haeberlen, St. Magdalen (AT);
Klaus Schiess, Allensbach (DE);
Gilberto Curatola, Villach (AT);
Gerhard Prechtl, Rosegg (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 15/411,379

(22) Filed: Jan. 20, 2017

(65) Prior Publication Data

US 2018/0211904 A1    Jul. 26, 2018

(51) Int. Cl.
*H01L 23/495* (2006.01)
*H01L 29/20* (2006.01)
*H01L 29/739* (2006.01)
*H01L 29/778* (2006.01)
*H01L 29/78* (2006.01)

(52) U.S. Cl.
CPC .... *H01L 23/49541* (2013.01); *H01L 23/4951* (2013.01); *H01L 23/49524* (2013.01); *H01L 23/49562* (2013.01); *H01L 29/2003* (2013.01); *H01L 29/7393* (2013.01); *H01L 29/778* (2013.01); *H01L 29/78* (2013.01)

(58) Field of Classification Search
CPC ... H01L 23/00; H01L 23/495; H01L 23/4951; H01L 23/49541; H01L 23/78; H01L 23/778; H01L 23/7393; H01L 23/2003; H01L 23/49562; H01L 23/49524
USPC .......................................................... 257/676
See application file for complete search history.

(56) References Cited

U.S. PATENT DOCUMENTS

| 5,250,439 A | * | 10/1993 | Musho | C12Q 1/002 204/403.11 |
| 7,417,257 B2 | | 8/2008 | Beach et al. | |
| 7,994,524 B1 | * | 8/2011 | Chung | H01L 27/156 257/100 |

(Continued)

OTHER PUBLICATIONS

Extended European Search Report from counterpart European Patent Application No. 18152086.7, dated Jun. 28 2018, 9 pp.

*Primary Examiner* — Chuong A Luu
(74) *Attorney, Agent, or Firm* — Shumaker & Sieffert, P.A.

(57) ABSTRACT

The disclosure is directed to techniques to evenly distribute current in interdigited leadframes by decoupling current between interdigited pads. The leadframe may use a perpendicular structure between the leadframe conductive pads and the lead traces. The perpendicular structure provides a short path for the current to travel from electrode pad openings on a device to the lead traces carrying current to other portions of a circuit. The conductive pad may be parallel to the electrode pad opening to lower spreading resistance. In an example of a transistor, the transistor may have two or more electrode pads for every current carrying node. Therefore, several electrode pads may have the same node, such as the source or drain of the device. For example, two or more source pads may be connected though the leadframe to evenly distribute the current and decouple the current from a single transistor.

20 Claims, 9 Drawing Sheets

(56) References Cited

U.S. PATENT DOCUMENTS

| | | |
|---|---|---|
| 7,994,632 B2 | 8/2011 | Hu et al. |
| 9,048,196 B2 | 6/2015 | Standing et al. |
| 9,048,838 B2 | 6/2015 | Otremba et al. |
| 2004/0119148 A1* | 6/2004 | Standing ............ H01L 23/5385 257/668 |
| 2008/0035959 A1 | 2/2008 | Jiang |
| 2008/0048218 A1 | 2/2008 | Jiang |
| 2010/0187664 A1 | 7/2010 | Polhemus et al. |
| 2010/0289095 A1* | 11/2010 | Poeppel ............ H01L 23/3128 257/414 |
| 2011/0198611 A1 | 8/2011 | Cheah et al. |
| 2015/0041994 A1* | 2/2015 | Gerber ............ H01L 23/49548 257/782 |
| 2015/0262843 A1* | 9/2015 | Hsieh .................. H01L 21/56 257/676 |

\* cited by examiner

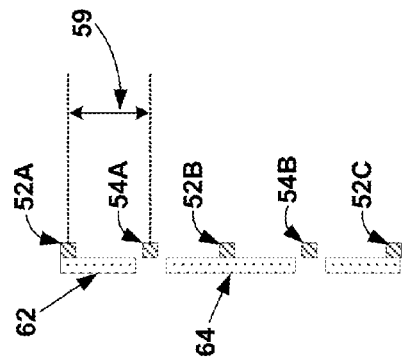
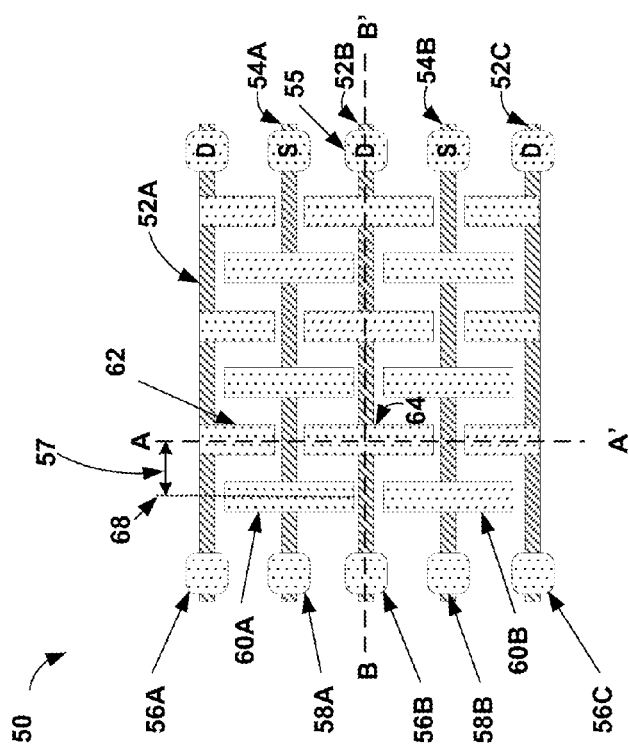
FIG. 1B
FIG. 1A
FIG. 1C

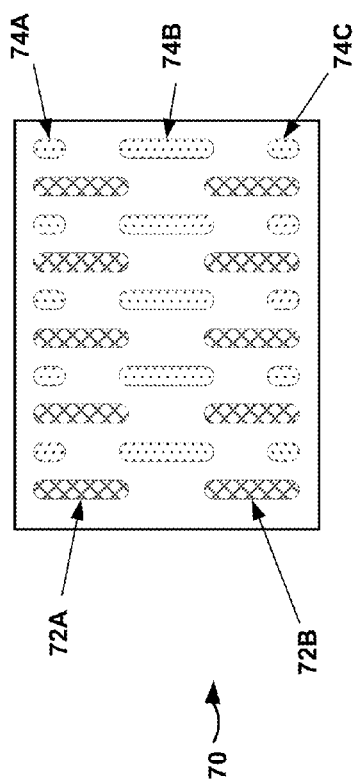
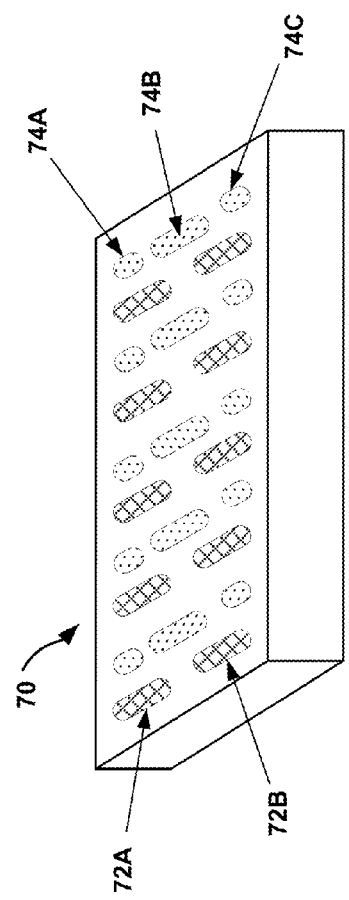

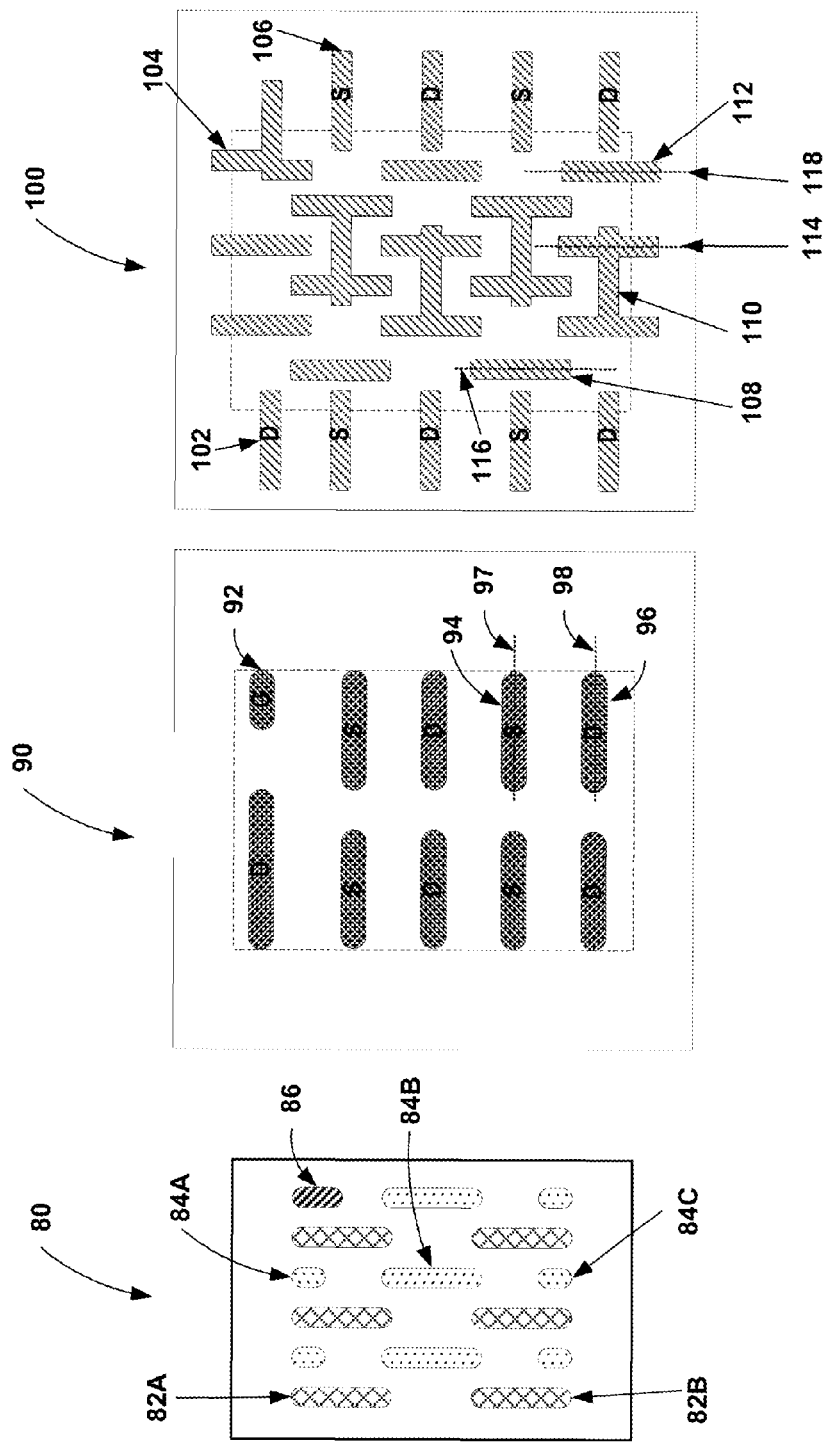

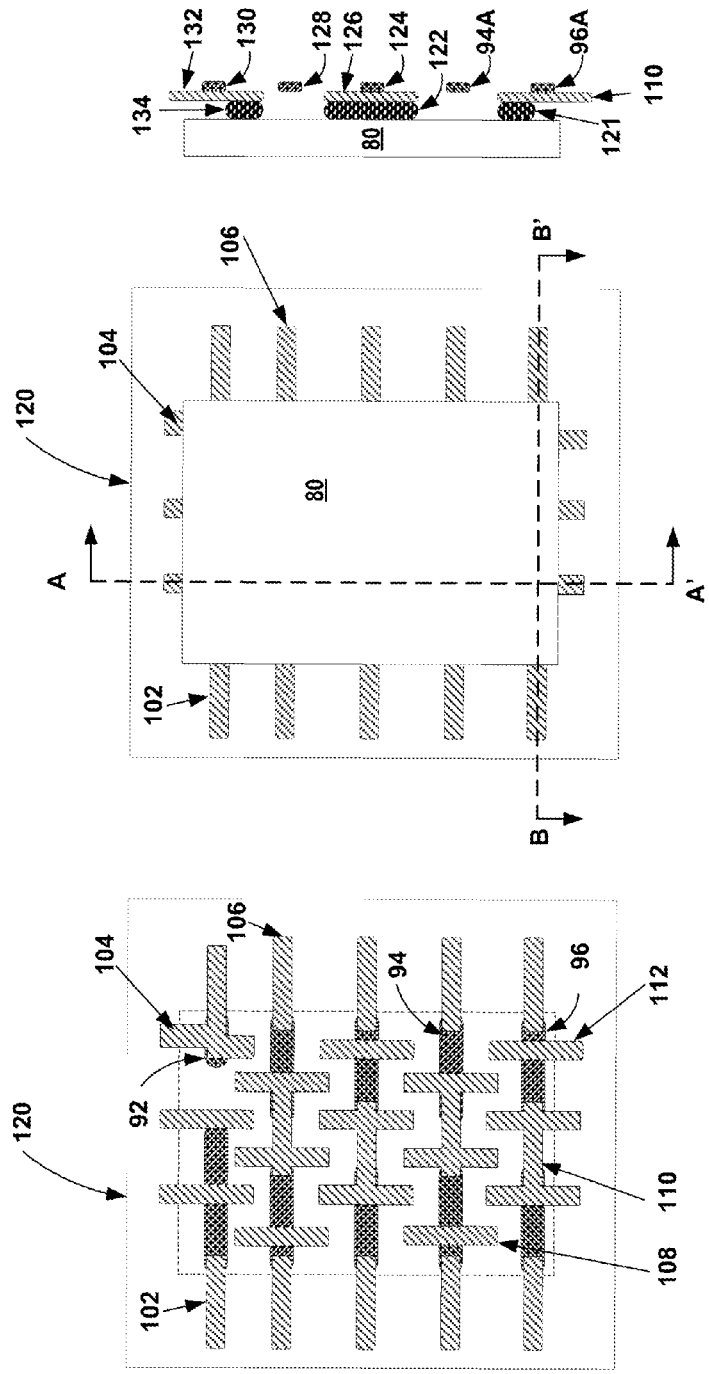
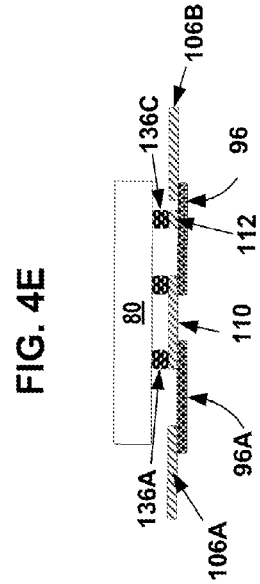

INTERDIGIT DEVICE ON LEADFRAME FOR EVENLY DISTRIBUTED CURRENT FLOW

TECHNICAL FIELD

The disclosure relates to relates to power leadframe packages, and techniques of fabricating power leadframe packages.

BACKGROUND

Interdigitited leadframe pads that carry signals from inter-digit electrode pads on devices, such as semiconductor devices, may have a variety of technical issues. Some examples include current density on the interface between the device and the package, which may induce risk of electromigration. In the example of transistor devices, the characteristics of the leadframe may contribute to RDSon. To increase circuit density and decrease component sizes, narrow pitch both between leadframe pads and the pitch of the pads themselves may have limitations, for example from manufacturability or to avoid metal whiskering or arcing between pads.

A half-bridge circuit may include two analog devices or switches. Half-bridge circuits may be used in power supplies for motors, in rectifiers, and for power conversion. Each half-bridge circuit package has several contacts and may include several conductive paths to connect the contacts to each other and to external components.

SUMMARY

In general, the disclosure is directed to techniques to evenly distribute current in interdigited leadframes by decoupling current between interdigited pads. Techniques of this disclosure utilize a perpendicular structure between the leadframe pads and the lead traces. The perpendicular structure provides a short path for the current to travel from electrode pad openings on a device to the lead traces carrying current to other portions of a circuit. The bottom half-etched conductive pad is further configured to be parallel to the electrode pad opening to lower spreading resistance.

In some examples, a leadframe, according to the techniques of this disclosure, may support an integrated semiconductor die that includes a half-bridge circuit. In other examples, the leadframe may support a half-bridge circuit along with a control or driver module, such as a control integrated circuit (IC). In some examples the leadframe may support one or more discrete interdigited transistors, such as split transistors. The techniques of this disclosure may be advantageous for a variety of semiconductor die, including gallium nitride.

By using the interdigit pads on the device but lead connections on the package level, all lead trace layouts may be perpendicular to both the electrode pads of device and the conductive interdigited pads on the leadframe. In an example of a transistor, the transistor may have two or more electrode pads for every current carrying node. In one example, every other electrode pads may have same node, such as the source or drain of the device. The two or more source pads may be connected though the leadframe to evenly distribute the current and decouple the current.

In one example, the disclosure is directed to a conductive leadframe device for a lateral conduction die, wherein the lateral conduction die includes a plurality of parallel spaced and interleaved electrode openings on a surface of the die, the conductive leadframe device comprising: a first plane and a second plane, a plurality of parallel spaced and interleaved conductive pads on the first plane of the conductive leadframe, wherein a respective conductive pad of the plurality of conductive pads defines a major axis of the respective conductive pad. The leadframe also comprising a plurality of parallel conductors on the second plane of the conductive leadframe, wherein a respective conductor of the plurality of parallel conductors defines a major axis of the respective conductor, and wherein the major axis of the respective conductive pad is substantially orthogonal to the major axis of the respective conductor at a location where the respective conductive pad electrically connects to the respective conductor.

In a second example, the disclosure is directed to a device comprising: a lateral conduction die, wherein the lateral conduction die includes a plurality of parallel spaced and interleaved electrode openings on a surface of the die; and a conductive leadframe. The conductive leadframe comprises: a first plane and a second plane, a plurality of parallel spaced and interleaved conductive pads on the first plane of the conductive leadframe, wherein a respective conductive pad of the plurality of conductive pads defines a major axis of the respective conductive pad, and a plurality of parallel conductors on the second plane of the conductive leadframe, wherein a respective conductor of the plurality of parallel conductors defines a major axis of the respective conductor. The major axis of the respective conductive pad is substantially orthogonal to the major axis of the respective conductor at a location where the respective conductive pad electrically connects to the respective conductor.

In another example, the disclosure is directed to a gallium nitride (GaN) semiconductor power device, the device comprising: a lateral conduction GaN semiconductor die, wherein the semiconductor die includes a plurality of parallel spaced and interleaved source and drain electrode openings on a surface of the semiconductor die; and a conductive leadframe. The conductive leadframe comprises: a first plane and a second plane; a plurality of parallel spaced and interleaved source and drain conductive pads on the first plane of the conductive leadframe, wherein a respective conductive pad of the plurality of conductive pads defines a major axis of the respective conductive pad, a plurality of parallel conductors on the second plane of the conductive leadframe, wherein a respective conductor of the plurality of parallel conductors defines a major axis of the respective conductor, and the major axis of the respective conductive pad is substantially orthogonal to the major axis of the respective conductor at a location where the respective conductive pad electrically connects to the respective conductor. And wherein: a respective conductive source pad of the plurality of parallel spaced and interleaved conductive source pads electrically connects to a respective source electrode opening of the plurality of parallel spaced and interleaved source electrode openings on the surface of the lateral conduction die, and a respective conductive drain pad of the plurality of parallel spaced and interleaved conductive drain pads electrically connects to a respective drain electrode opening of the plurality of parallel spaced and interleaved drain electrode openings on the surface of the lateral conduction die.

The details of one or more examples of the disclosure are set forth in the accompanying drawings and the description below. Other features, objects, and advantages of the disclosure will be apparent from the description and drawings, and from the claims.

BRIEF DESCRIPTION OF DRAWINGS

FIG. 1A is a diagram illustrating an example conductive leadframe with interdigited conductive pads in accordance with one or more techniques of this disclosure.

FIGS. 1B and 1C are side-view diagrams of a leadframe with a perpendicular structure, in accordance with some examples of this disclosure.

FIGS. 2A and 2B depict a bottom view and a perspective view, respectively, of a lateral conduction die that includes a plurality of parallel spaced and interleaved electrode openings on a surface of the die, in accordance with one or more techniques of this disclosure.

FIG. 4A is bottom-side view of a lateral conduction die with parallel spaced and interleaved electrode openings on the bottom surface of the die, in accordance with one or more techniques of this disclosure.

FIG. 4B is a diagram illustrating a layer of a leadframe with a plurality of parallel leads or conductors in accordance with the techniques of this disclosure.

FIG. 4C is a diagram illustrating a layer of a leadframe with a plurality of parallel spaced and interleaved conductive pads that may electrically connect to electrode openings on a lateral conduction die, in accordance with techniques of this disclosure.

FIG. 4D is top-view diagram that illustrates a first layer including conductive pads combined with a second layer including conductive leads in accordance with techniques of this disclosure.

FIG. 4E is a top-view diagram of a leadframe connected to a lateral conduction die in accordance with one or more techniques of this disclosure.

FIGS. 4F and 4G are side-view diagrams of a leadframe connected to a lateral conduction die, in accordance with some examples of this disclosure.

DETAILED DESCRIPTION

Figure 3:
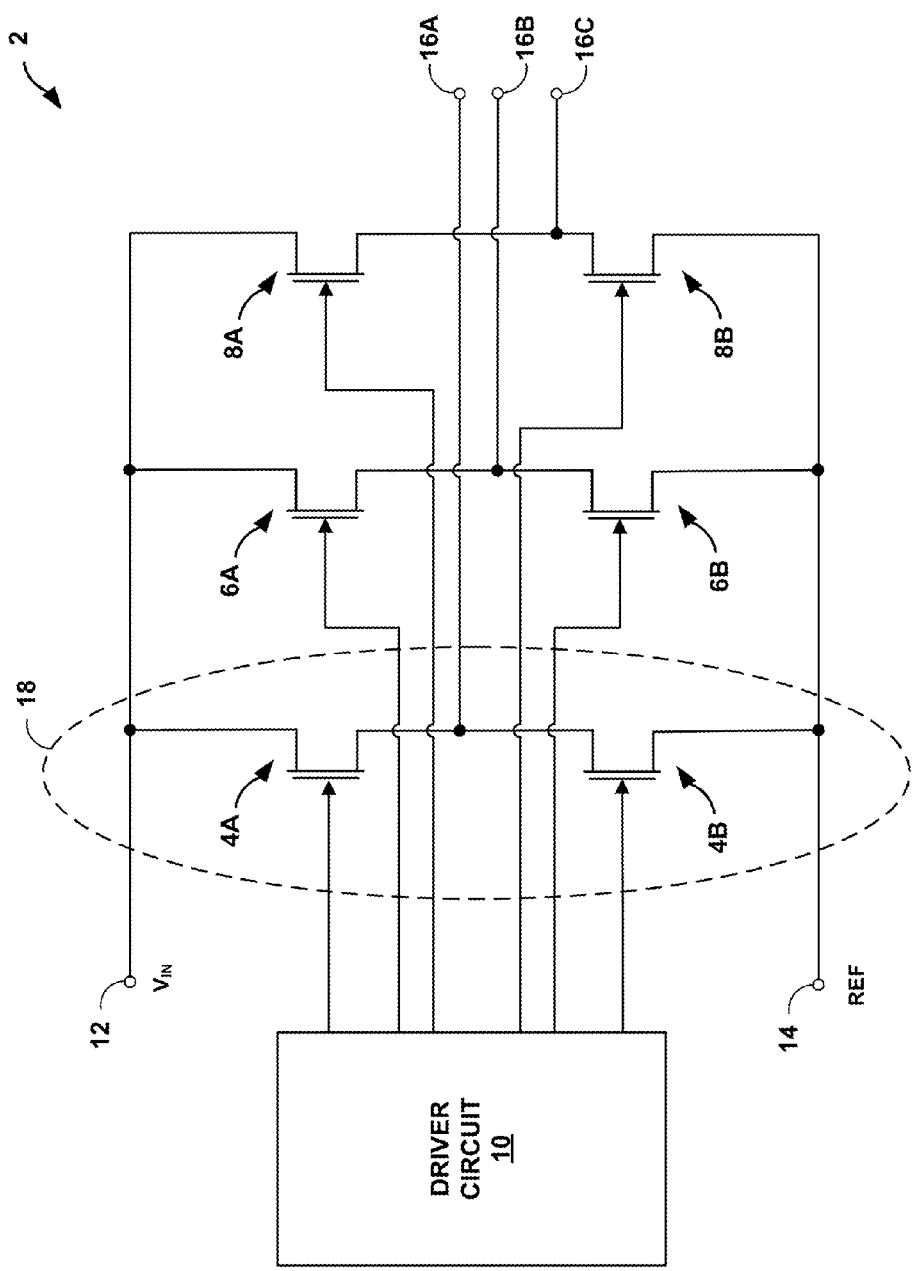
FIG. 3 is a circuit diagram of an example multi-phase power converter, in accordance with some examples of this disclosure.

This disclosure is directed to techniques evenly distribute current in interdigited leadframes by decoupling current between interdigited pads. Techniques of this disclosure utilize a perpendicular structure between the leadframe pads and the lead traces carrying current to other portions of a circuit. The perpendicular structure provides a short path for the current to travel from electrode pad openings on a device, such as a semiconductor die, and the lead traces carrying current to other portions of a circuit. The bottom half-etched conductive pad is further configured to be parallel to the electrode pad opening to lower spreading resistance. The interdigited leadframe pads may be closely matched in size and shape to the size and shape of the electrode pad openings of the device.

The perpendicular structure that provides the short path for current to travel may be implemented in a variety of ways. In some examples a leadframe, according to the techniques of this disclosure, may support an integrated semiconductor die that includes a half-bridge circuit. In other examples, the leadframe may support the integrated half-bridge circuit along with a control or driver module, such as a control integrated circuit (IC). In some examples the leadframe may support one or more discrete interdigited transistors, such as split transistors, arranged as a half-bridge, or some other circuit. The techniques of this disclosure may be advantageous for a variety of semiconductor die, including gallium nitride (GaN), such as III-Nitride heterojunction die. Some example components using GaN may also be referred to as binary III/V direct bandgap semiconductors.

By using the interdigit pads on the device but lead connections on the package (PKG) level, means that all of lead trace layouts may be perpendicular to both the electrode pads of device and the conductive interdigited pads on the leadframe. In an example of a transistor, the transistor may have two or more electrode pads for every current carrying node. For example, every other electrode pads may have same node, such as the source or drain of the device. The two or more source pads may be connected though the leadframe to evenly distribute the current and decouple the current. The shared current path may be similar to a net interwoven between the pads of device, through the pads of the leadframe and to the leads of the leadframe. With the techniques of this disclosure, a lead of copper (Cu) or some other conductive material on the leadframe may be the current carrying path. The lead may be thicker than other traces on the leadframe to reduce current density.

FIG. 1A is a diagram illustrating an example conductive leadframe with interdigited conductive pads in accordance with one or more techniques of this disclosure. The conductive pad layout of the example of FIG. 1A-1C may be used with the lateral conduction die depicted in FIG. 2A-2B.

Conductive leadframe 50 includes a plurality of parallel spaced and interleaved conductive pads 60A-60B, 62 and 64, and outer package pads 56A-56C, 58A-58B on a first plane of the leadframe. On a second plane of the leadframe, conductive leadframe 50 includes a plurality of parallel conductors 52A-52C and 54A-54B. Some conductive pads, for example, 60A-60B, 62 and 64 are arranged in an interdigited pattern. Interdigited pattern means, for example, using a single multi-fingered transistor to implement two or more transistors that share a source or a drain.

Interdigited pattern may also be used for common centroid layout. Common centroid layout may be used with differential pairs of components. Common centroid layout is a matching method in which the two transistors, or other components, of the differential pair are symmetrically laid out about an axis. This may guarantee that both transistors have the same process variations so they may be matched under all conditions, within manufacturing and measurement tolerances.

As shown in FIG. 1A, very other electrode pads may have same node, such as the source or drain of the device. For example, conductive pads 60A-60B are source pads that connect through the leadframe to leads 54A and 54B respectively. The two or more source pads may be connected though the leadframe to evenly distribute and decouple the current. Leads, 54A-54B and 52A-52C may be a thick copper lead on the leadframe and act as the current carrying path. For clarity, the explanation of this disclosure may focus on the example of a field effect transistor (FET) with source, drain and gate terminals. However, the techniques of this disclosure are not limited to use with a FET.

For clarity, not every conductive pad includes a reference number in FIGS. 1A-1C. As the conductive pads are arranged in a repeating pattern, a conductive pad with a reference number may have additional, non-numbered pads that perform the same function. For example, FIG. 1A depicts conductive pad 62 and conductive pad 64 that may connect to drain electrode openings on conductive die 70 depicted in FIG. 2, as well as two additional sets of conductive pads similar to conductive pads 62 and 64.

FIG. 1A depicts conductive pad 60A, as well as other conductive pads in leadframe 50 as including a longer dimension and a shorter dimension. The longer dimension of conductive pad 60A defines a major axis 68 along the longer dimension or the length of the conductive pad. The shorter dimension of the conductive pad may be referred to as the width of the conductive pad. All other conductive pads shown in FIG. 1A also have a major axis (not shown) along the longer dimension of the conductive pad. Lead 54A may also be referred to as a lead trace, or a conductor in this disclosure. Lead 54A, as depicted in FIG. 1A also has a longer dimension and a shorter dimension. Lead 54A also defines a major axis (not shown) along the longer dimension. The major axis 68 of conductive pad 60A is substantially perpendicular to the major axis of lead 54A. Substantially perpendicular, or substantially orthogonal, means perpendicular within manufacturing and measurement tolerances.

The arrangement of leadframe conductive pads and lead traces described in this disclosure may have advantages of lower PKG resistance along with a good thermal dissipation path, when compared to conventional techniques. The perpendicular structure provides a short path for the current to travel from electrode pad openings on a lateral conduction die that are electrically connected to the conductive pads, to the lead carrying current to other portions of a circuit, such as conductors, or leads 52A-52C. This structure may also avoid the multiple layers that may be found with some conventional techniques. Multiple layers may lead to low thermal dissipation and increased current path impedance. The bottom half-etched conductive pads, such as pads 60A-60B, are further configured to be parallel to the electrode pad opening to lower spreading resistance. With a larger die and larger leadframe, a conventional parallel structure may lead to even longer traces and longer current path. However, the perpendicular structure may still provide a shorter current path as die size gets larger. In some examples, the current path may be one-half the length of the conductive pad, which may be less than 0.5 mm.

Additionally, techniques of this disclosure may result in lead-to-lead clearance and creepage distance that may be wide enough to handle mid to high voltage circuits. Mid to high voltage may include voltages in the range of 80V to 1000V, for example. In some examples, the conductive pad pitch 57 between the major axis of a respective source conductive pad, such as conductive pad 60A and the major axis of a respective drain conductive pad, such as conductive pad 64, is approximately 400 μm, where approximately means within manufacturing and measurement tolerances.

In some examples, the pitch size for a leadframe maybe be in the range of 200 μm or, in the case of a laminate leadframe, less than 150 μm. In some examples, the leadframe conductive pad pitch, or laminate substrate pad pitch will have the same pitch as the pad pitch on the device. The leadframe pitch for the lead traces (59), such as between lead traces 52A and 54A, may depend on the creepage distance required for the operating voltage of a device. For example, a minimum creepage distance may be 0.7 mm for 100V and 0.75 mm for 200V. Therefore, the minimum pitch between two outer package pads, such as 55, 58A and 56C may be set to the minimum creepage distance for the device operating voltage.

In the example of FIG. 1A, the conductive pad pitch distance 57 may be less than the minimum creepage distance required for the outer package pads, such as pitch 59. This may provide advantages to maintain a lower pitch distance on a die, such as lateral conduction die 70 depicted in FIG. 2A, while maintaining a minimum creepage distance for the outer package pads. Throughout this disclosure, the term "pitch" may also be referred to as "pitch distance," or "pitch size."

FIG. 1B is a side-view diagram of a leadframe with a perpendicular structure, in accordance with some examples of this disclosure. The conductive pads and lead traces in FIGS. 1B and 1C may include the same or similar terminals as described with respect to FIG. 1A. FIG. 1B may correspond to the dashed line A-A' in FIG. 1A.

FIG. 1B depicts conductive pads 62 and 64, as well as lead traces, or conductors, 52A-52C and 54A-54B. FIG. 1B depicts the structure of the major axis of conductive pad 64 as substantially perpendicular to the major axis of conductor 52B. The perpendicular structure creates a short path for the current to travel through conductive pad 64 to lead 52B. The current path will be described in more detail in relation to FIG. 4H below.

FIG. 1B depicts an end-view of a plurality of parallel conductors 52A-52C and 54A-54B on the second plane of conductive leadframe 50 as well as the spacing between the parallel conductors. FIG. 1B also depicts the parallel spaced and interleaved conductive pads on the first plane of the conductive, with leads 54A and 54B. Leads 54A and 54B are connected to the source pads of leadframe 50.

FIG. 1C is a side-view diagram of a leadframe with a perpendicular structure, in accordance with some examples of this disclosure. FIG. 1C may correspond to the dashed line B-B' in FIG. 1A.

FIG. 1C depicts drain lead 52B on the second plane of leadframe 50, connected to drain conductive pads, such as outer package conductive pads 55, 56B and 64. Conductive pads 55 and 56B may not directly connect to a lateral conduction die as does conductive pad 64. In FIGS. 1A and 1C, conductive pads 55, 56A-56C and 58A-58B may connect to other portions of a larger circuit that includes leadframe 50. FIG. 1C depicts how the major axis (not shown) of the longer dimension of lead 52B connects to the drain pads, such as conductive pad 64, in a perpendicular structure.

FIGS. 2A and 2B depict a bottom view and a perspective view, respectively, of a lateral conduction die that includes a plurality of parallel spaced and interleaved electrode openings on a surface of the die, in accordance with one or more techniques of this disclosure. The plurality of parallel spaced and interleaved conductive pads depicted in FIGS. 1A-1C may correspond to the plurality of parallel spaced and interleaved electrode openings the surface of lateral conduction die 70. In some examples electrode openings on the surface of the die may also be called electrode strips or pads.

FIGS. 2A and 2B depict electrode openings 72A-72B and 74A-74C on the bottom surface of lateral conduction die 70. Electrode openings may also be referred to as electrode pads or electrode pad openings throughout this disclosure. In an example of a transistor, electrode openings 72A and 72B may be source pads of a single transistor, a multi-transistor die such as one or more discrete interdigited transistors arranged as a half-bridge, or a similar circuit. For example, if used with leadframe 50, depicted in FIG. 1A, lateral conduction die 70 may be a discrete transistor with multiple source and drain pads to evenly distribute and decouple current through the die.

Figure 5A:
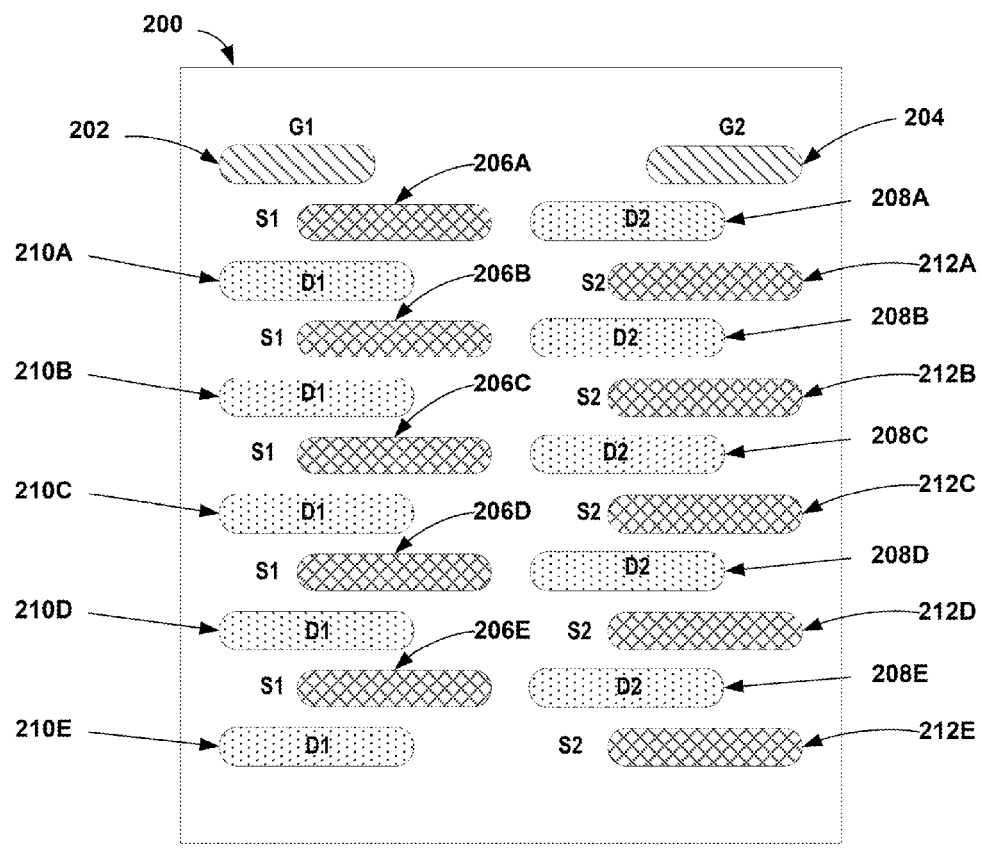
FIG. 5A is a bottom-view of a lateral conduction die configured as an integrated half-bridge circuit, in accordance with some examples of this disclosure.

Electrode openings 72A and 72B may electrically connect to source conductive pads 60A and 60B of FIG. 1A. Similarly, electrode openings 74A-74C may electrically connect to the conductive drain pads of leadframe 50, such as conductive pads 62 and 64. The examples of FIGS. 1A and 2A-2B depict the drain pads as a larger conductive drain pad 64, and electrode opening 74B, along with shorter conductive drain pads, such as pad 62 and electrode openings 74A and 74C. In other examples, the source pads and openings may be in the long-short structure that the drain pads and openings are depicted in FIGS. 1A and 2A. In still other examples, the source and drain pads may have a more symmetric layout, such as depicted in the example of FIG. 5A.

The perpendicular structure allows for a shorter current path which may reduce the current density on the interface between the device and the package, which may therefore reduce the risk of electromigration. In the example of transistor devices, the perpendicular structure may reduce RDSon, which will be described in more detail below in relation to FIGS. 4 and 5.

FIG. 3 is a circuit diagram of an example multi-phase power converter, in accordance with some examples of this disclosure. In some examples, device 2 may comprise a multi-phase power converter such as a half-bridge direct-current-to-direct-current (DC/DC) buck converter for converting an input DC signal to an output DC signal with a lower voltage. For each phase, a multi-phase power converter may comprise a half-bridge circuit. As a DC-to-DC buck converter, device 2 may operate as a voltage regulator in a variety of applications. In some examples, device 2 may be designed for high-power applications large amounts of current and high voltages. However, the techniques of this disclosure may apply to other circuits and configurations, such as other power converters, including multi-phase power converters and alternating-current-to-DC (AC/DC) power converters. Evenly distributing and decoupling the current may be advantageous for power converters or similar circuits.

Device 2 may include transistors 4A, 4B, 6A, 6B, 8A, 8B and driver circuit 10. In some examples, device 2 may contain more or fewer components than depicted in FIG. 3. Device 2 may include input node 12, reference node 14, and output nodes 16A-16C, as well as other nodes not shown in FIG. 3. Nodes 12, 14, and 16A-16C may be configured to connect to external components. For example, input node 12 may connect to an input voltage such as a power supply and reference node 14 may connect to a reference voltage, such as reference ground. Output nodes 16A-16C may connect to a load such as an electronic device. Each output nodes 16A-16C may supply one phase of an output voltage to another device or circuit. In some examples, driver circuit 10 may connect to an external circuit through a node (not shown in FIG. 3).

Transistors 4A, 4B, 6A, 6B, 8A, 8B may comprise metal-oxide semiconductor (MOS) field-effect transistors (FETs), bipolar junction transistors (BJTs), and/or insulated-gate bipolar transistors (IGBTs). Transistors 4A, 4B, 6A, 6B, 8A, 8B may comprise n-type transistors or p-type transistors. In some examples, transistors 4A, 4B, 6A, 6B, 8A, 8B may comprise other analog devices such as diodes. Transistors 4A, 4B, 6A, 6B, 8A, 8B may also include freewheeling diodes connected in parallel with transistors to prevent reverse breakdown of transistors 4A, 4B, 6A, 6B, 8A, 8B. In some examples, transistors 4A, 4B, 6A, 6B, 8A, 8B may operate as switches, as analog devices, and/or power transistors.

Although, transistors 4A, 4B, 6A, 6B, 8A, 8B are shown in FIG. 3 as MOSFET symbols, it is contemplated that any electrical device that is controlled by a voltage may be used in place of the MOSFETs as shown. For example, transistors 4A, 4B, 6A, 6B, 8A, 8B may include, but not limited to, any type of field-effect transistor (FET), a bipolar junction transistor (BJT), an insulated-gate bipolar transistor (IGBT), a high-electron-mobility transistor (HEMT), a gallium-nitride (GaN) based transistor, or another element that uses voltage for its control.

Transistors 4A, 4B, 6A, 6B, 8A, 8B may comprise various material compounds, such as silicon (Si), silicon carbide (SiC), Gallium Nitride (GaN), or any other combination of one or more semiconductor materials. To take advantage of higher power density requirements in some circuits, power converters may operate at higher frequencies. Improvements in magnetics and faster switching, such as Gallium Nitride (GaN) switches, may support higher frequency converters. These higher frequency circuits may require control signals to be sent with more precise timing than for lower frequency circuits.

Driver circuit 10 may deliver signals and/or voltages to the control terminals of transistors 4A, 4B, 6A, 6B, 8A, 8B. Driver circuit 10 may perform other functions. Together, transistors 4A, 4B, 6A, 6B, 8A, 8B and driver circuit 10 may comprise one or more semiconductor package such as a semiconductor die, chip-embedded substrate, an integrated circuit (IC), or any other suitable package. In some examples, driver circuit 10 may be integrated into the package with one or more of transistors 4A, 4B, 6A, 6B, 8A, 8B, or driver circuit 10 may be a separate IC.

Half-bridge circuit 18 may comprise transistors 4A, 4B. Transistors 4A, 4B may be coupled to each other and to output node 16A. Half-bridge circuit 18 may produce one phase of an output voltage for device 2. Transistors 6A, 6B and transistor 8A, 8B may each produce other phases of the output voltage for device 2.

FIG. 4A is bottom-side view of a lateral conduction die with parallel spaced and interleaved electrode openings on the bottom surface of the die, in accordance with one or more techniques of this disclosure. Lateral conduction die 80 is similar to lateral conduction die 70 depicted in FIG. 2A. Lateral conduction die 80 has fewer electrode openings than lateral conduction die 70 and includes a gate electrode. In some examples, lateral conduction die 80 may contain a single, discrete transistor.

Electrode openings 82A and 82B may be source electrodes of a single. Though not numbered for clarity, lateral conduction die 80 depicts six source electrode openings.

Similarly, electrode openings 84A-84C depict drain electrodes in a short-long pattern, similar to lateral conduction die 70.

Lateral conduction die 80 also includes gate electrode opening 86. In the example where lateral conduction die 80 is a single discrete transistor with multiple source and drain pads to evenly distribute and decouple current through the die, gate 86 may control the operation of the transistor.

FIG. 4B is a diagram illustrating a layer of a leadframe with a plurality of parallel leads or conductors in accordance with the techniques of this disclosure. The parallel conductors of FIG. 4B are similar to parallel leads 52A-52C and 54A-54B depicted in FIG. 1A. In the example of leadframe layer 90, every other lead may have same node, such as the source or drain of the device. The source leads are marked with "S" such as lead 94. Drain leads are marked with "D," such as drain lead 96. Gate lead 92 may electrically connect to gate electrode opening 86 through the leadframe layer depicted by layer 100 in FIG. 4C. In other examples, a different source and drain lead layout may be used.

The drain and source leads of layer 90 each define a respective major axis of the lead. For example, source lead 94 defines major axis 97, while drain lead 96 defines major axis 98. The other drain and source leads define similar major axes. The major axes of the drain and source leads define are substantially perpendicular to the conductive pads depicted in layer 100, as described in more detail below.

The drain and source leads, such as 94 and 96 may be a thick copper lead, or similar conductive material, on the leadframe and act as the current carrying path. The thickness and other dimensions of the drain and source leads may depend on the purpose and function of the circuit as well as the thickness of the leadframe. For example, a circuit that carries higher current than a second circuit may have a thicker lead than the second circuit to reduce the current density and manage heat dissipation. Also, as an example, a 150 μm (6 mil) leadframe may include half-etched or full-etched leads or conductive pads, which may be in the range of 60-150 μm thick. Similarly, a 200 μm (8 mil) leadframe may have leads or conductive pads in the range of 80-200 μm. As above, the explanation of this disclosure may focus on the example of a field effect transistor (FET) with source, drain and gate terminals. However, the techniques of this disclosure are not limited to use with a FET.

FIG. 4C is a diagram illustrating a layer of a leadframe with a plurality of parallel spaced and interleaved conductive pads that may electrically connect to electrode openings on a lateral conduction die, in accordance with the techniques of this disclosure. The conductive pads depicted in FIG. 4C are similar to the conductive pads depicted in FIGS. 1A and 5B.

As described above in relation to FIG. 1A, the conductive pads depicted in leadframe layer 100 define are arranged substantially perpendicular to the conductors, or leads, on layer 90. For example, conductive source pad 108 defines a major axis 116. Major axis 116 is substantially perpendicular to major axis 97 of source lead 94 on leadframe layer 90. Similarly, conductive drain pad 112 defines major axis 118, which is substantially perpendicular to major axis 98 of drain lead 96.

Layer 100 includes conductive pads that further include a conductive segment on the first plane of the conductive leadframe. The conductive segment electrically connects a first respective conductive pad to at least a second respective conductive pad. For example, conductive drain pads 110 include a conductive segment that electrically connects two conductive drain pads. The conductive segment of drain pad 110 does not correspond to an electrode opening of lateral conduction die 80, as depicted in FIG. 4A. However, the two conductive pads of drain pad 110 each define a respective major axis, such as major axis 114. The major axis of each conductive pad of drain pad 110 is arranged substantially orthogonal to the leads on layer 90 at the point where the respective conductive pad electrically connects to the respective lead. For example, major axis 114 is depicted as substantially perpendicular to major axis 98 of drain lead 96. In other examples, a conductive segment connecting two or more conductive pads may be arranged in a different configuration. However, the major axis of the respective conductive pad may be arranged substantially orthogonal to the respective lead on layer 90 at the point where the respective conductive pad electrically connects to the respective lead. The perpendicular arrangement may provide the advantages discussed above in relation to FIGS. 1A-1C. Though not numbered for clarity, FIG. 4C depicts additional conductive pads for both source and drain, similar to conductive pad 110.

In the example of FIG. 4C, layer 100 includes additional conductive segments that may connect the circuit to other portions of a larger circuit. For example, alternating source and drain conductive segments such as drain segment 102 and source segment 106. Layer 100 may also include a conductive segment 104 to connect the gate electrode 86 to a control IC, driver module or similar circuit.

FIG. 4D is top-view diagram that illustrates a first layer including conductive pads combined with a second layer including conductive leads in accordance with techniques of this disclosure. FIG. 4D depicts leadframe 120 with a plurality of parallel spaced and interleaved conductive pads and a plurality of parallel conductors. Conductive segments 102 and 104 and 106, conductive drain pads 110 and 112, conductive source pad 108 as well as conductive leads 92, 94 and 94 correspond to similar items described in relation to FIGS. 4B and 4C. FIG. 4D depicts the conductive pads on the first layer substantially perpendicular to the leads on the second layer, as described above.

FIG. 4E is a top-view diagram of a leadframe connected to a lateral conduction die in accordance with one or more techniques of this disclosure. FIG. 4E depicts a top-view of lateral conduction die 80 supported by leadframe 120. Lateral conduction die 80 corresponds to lateral conduction die 80 depicted in FIG. 4A. Leadframe 120, and conductive segments 102, 104 and 104 correspond to similar items depicted in FIG. 4D.

FIG. 4F is a side-view diagram of a leadframe connected to a lateral conduction die, in accordance with some examples of this disclosure. FIG. 4F may correspond to the dashed line A-A' in FIG. 4E.

FIG. 4F includes conductive pad 110, drain lead 96A and source lead 94A. Conductive pad 110 corresponds to conductive pad 110 depicted in FIG. 4D. Drain lead 96A and source lead 94A are in line with drain lead 96 and source lead 94 respectively, as depicted in FIG. 4D. FIG. 4F also includes conductive pads 126 and 132, drain leads 124 and 130, and source lead 128. The conductive pads and leads depicted in FIG. 4F are similar to the parallel spaced and interleaved conductive pads and parallel leads depicted in FIG. 1B and perform the same functions. The perpendicular structure of the conductive pads and leads provide the same advantages to those described in relation to FIG. 1B.

The electrode openings on the bottom of lateral conduction die 80 (not shown in FIG. 4F) electrically connect to conductive pads 110, 126 and 132 with electrical connections 121, 122 and 134, respectively. Electrical connections 121, 122 and 134 may be solder, such as tin-lead solder or lead-free solder, an electrical adhesive, such as conductive epoxy, or some similar type of electrical connection.

FIG. 4G is a side-view diagram of a leadframe connected to a lateral conduction die 80, in accordance with some examples of this disclosure. FIG. 4G may correspond to the dashed line B-B' in FIG. 4E.

FIG. 4G includes conductive pads 110 and 112, drain leads 96 and 96A, conductive segments 106A and 106B. Conductive pad 110 correspond to conductive pads 110 and 112 depicted in FIG. 4D. Drain leads 96 and 96A correspond to drain lead 96 and 96A depicted in FIGS. 4D and 4F. The electrode openings on the bottom of lateral conduction die 80 (not shown in FIG. 4G) electrically connect to conductive pads 110 and 112 with electrical connections 136A and 136C, respectively. Conductive pad 110 also connects to a second electrode opening of lateral conduction die 80 via a second electrical connection, which is not numbered to simplify FIG. 4G. As with FIG. 4F above, the conductive pads and leads depicted in FIG. 4G are similar to the parallel spaced and interleaved conductive pads and parallel leads depicted in FIG. 1B and perform the same functions. The combination of FIGS. 4E-4G depict the perpendicular structure of the conductive pads and leads as described in relation to FIG. 1B and provide the same advantages.

Figure 4H:
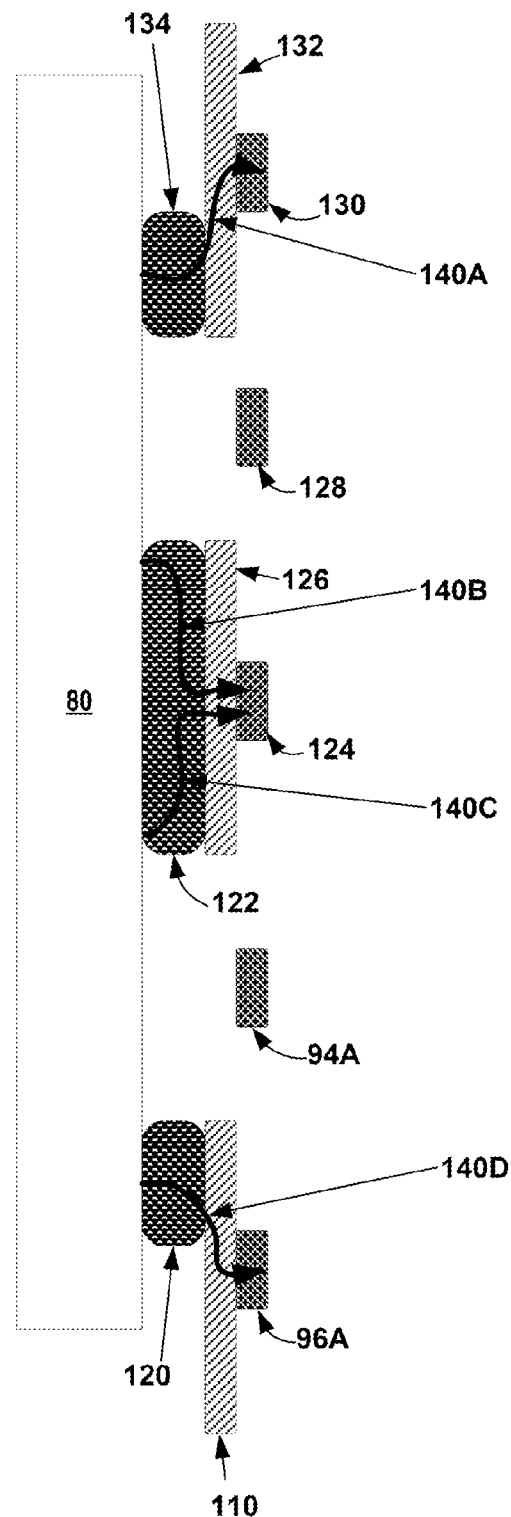
FIG. 4H is an expanded side-view diagram of a leadframe connected to a lateral conduction die that also depicts the current flow, in accordance with some examples of this disclosure.

FIG. 4H is an expanded side-view diagram of a leadframe connected to a lateral conduction die that also depicts the current flow, in accordance with some examples of this disclosure. FIG. 4H may correspond to the dashed line A-A' in FIG. 4E, as does FIG. 4F.

FIG. 4H is an expanded view of FIG. 4F that is enlarged to show an example current path between the electrode pads of lateral conduction die 80 and the parallel leads. FIG. 4H depicts parallel spaced and interleaved conductive pads 110, 124 and 130 on a first layer and a plurality of parallel conductors 96A, 94A, 126, 128 and 132 on a second layer of a leadframe, such as leadframe 120 depicted in FIG. 4D. The perpendicular structure between the conductive pads and leads at the location where the respective conductive pad electrically connects to the respective lead, or conductor, form a "T-shape" or "wing-shape". For example, conductive pad 126 electrically connects to lead 124, as shown in FIG. 4H to form a wing shape, with conductive pad 126 forming a set of wings over a "body" shape of lead 124. The wing or T-shape creates a short path for current (140B and 140C) to flow from the electrode opening on lateral conduction die 80 (not shown in FIG. 4H), through electrical connection 122 to conductive pad 126 and further to lead 124. Similarly, current 140A and 140D flow from the electrode opening on the surface of the die to leads 130 and 96A respectively.

The arrangement of leadframe pads and lead traces described in this disclosure may have advantages of lower PKG resistance along with a good thermal dissipation path, when compared to conventional techniques. For example, the perpendicular structure provides a short path for the current to travel from electrode pad openings on lateral conduction die 80 to the lead that is carrying current to other portions of a circuit, such as leads 96A, 126 and 132. The current path, which is shorter when compared to leads connected in parallel or some similar manner, may reduce the path impedance and, in the case of a transistor, reduce the RDSon. This structure may also avoid the multiple layers that may lead to low thermal dissipation and increased current path impedance. The bottom half-etched conductive pads, such as pads 110, 124 and 130, are further configured to be parallel to the electrode pad opening on the die to reduce the spreading resistance.

FIG. 5A is a bottom-view of a lateral conduction die configured as an integrated half-bridge circuit, in accordance with some examples of this disclosure. Lateral conduction die 200 implements a half-bridge circuit similar to half-bridge circuit 18 depicted in FIG. 3. The two transistors in lateral conduction die 200 include a plurality of electrode pads for every current carrying node. In the example of FIG. 5A, every other electrode pads may have same node, such as the source or drain of the device. The source and drain pads may be connected though the leadframe, such as leadframe 250 depicted in FIG. 5D, to evenly distribute and decouple the current. The shared current path may be similar to a net interwoven between the pads of device, where the current travels through the pads of the leadframe and to the leads of the leadframe.

Lateral conduction die 200 includes a gate pad for each transistor in the half-bridge circuit, G1 (202) and G2 (204) as well as source pads S1 (206A-206E) and drain pads D1 (210A-210E) for transistor 1 (not shown in FIG. 5A). The electrode pads for transistor 2 (not shown in FIG. 5A) include source pads S2 (212A-212E) and drain pads D2 (208A-208E). The example of FIG. 5A depicts five electrode pads for each current carrying node, however, in other examples a lateral conduction die according to the techniques of this disclosure may have more or fewer electrode pads for each node.

Figure 5B:
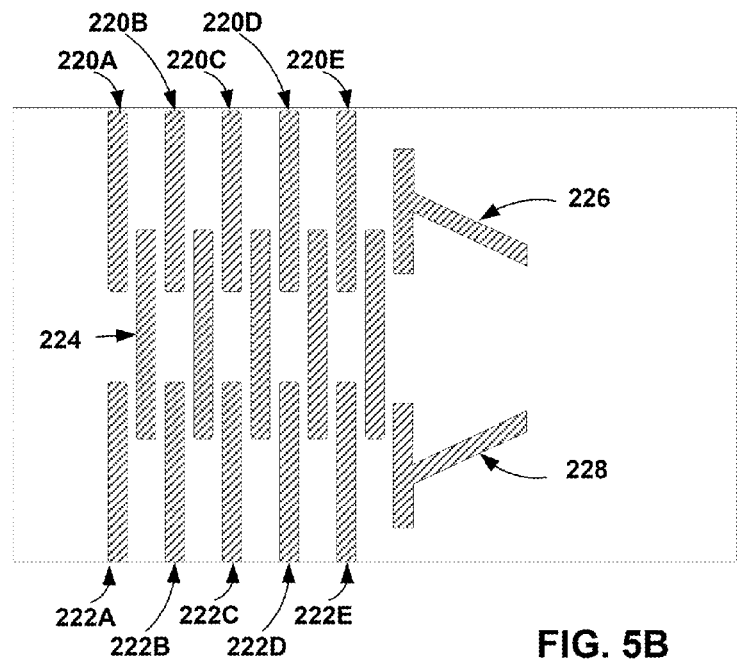
FIGS. 5B and 5C are diagrams illustrating a first and second layer of a leadframe that may support a lateral conduction die, in accordance with one or more techniques of this disclosure.
Figure 5C:
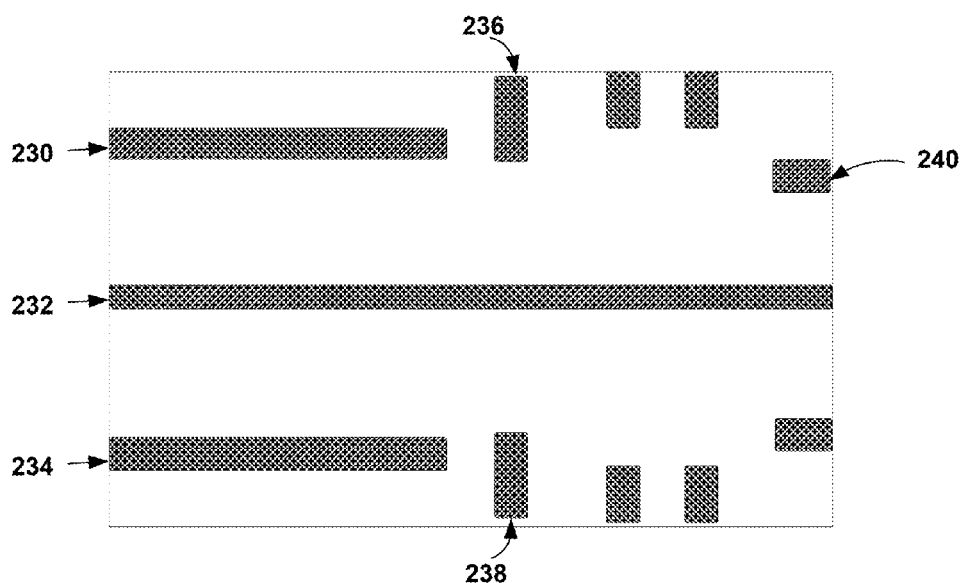

FIGS. 5B and 5C are diagrams illustrating a first and second layer of a leadframe that may support a lateral conduction die, in accordance with one or more techniques of this disclosure. FIG. 5B is similar to leadframe layer including parallel spaced and interleaved conductive pads depicted in FIGS. 1A and 4C. FIG. 5C is similar to the leadframe layer illustrating a plurality of parallel conductors or leads depicted by FIGS. 1A and 4B. As described above, the terms conductors or leads may be used interchangeably in this disclosure.

In the example of FIG. 5B, conductive pads 220A-220E may correspond to drain electrode pads 210A-210E in FIG. 5A. Similarly, conductive pads 222A-222E may correspond to source electrode pads, or openings, 212A-212E. Electrode pads 224, which for clarity are not all numbered, may connect the source pads 206A-206E of transistor 1 to the drain pads 208A-208E of transistor 2, similar to the connections between transistors 4A and 4B depicted in FIG. 3. Conductive pads 226 and 228 may connect gate electrode pads G1 and G2 to a control IC or driver circuit also connected to the leadframe. The conductive pads may be half-etched conductive pads and are configured to be parallel to the electrode pad openings on the die to lower spreading resistance.

In the example of FIG. 5B, the parallel leads 230, 232 and 234 are substantially perpendicular to the conductive pads of FIG. 5B at the location where the conductive pads electrically connect to the leads. This is shown also in leadframe 250 depicted by FIG. 5D. Lead 230 may correspond to the input node 12 (Vin), lead 232 may correspond to output node 16A, and lead 234 may correspond to reference node 14. In some examples output node 16A may be called a switch node (SW) and reference node 14 may be called ground.

Leads 236, 238 and 240, and other of FIG. 5C leads not numbered for clarity, may connect terminals of the leadframe to other terminals of a larger circuit. For example, leads 236 and 238 may connect to gate nodes G1 and G2.

Figure 5D:
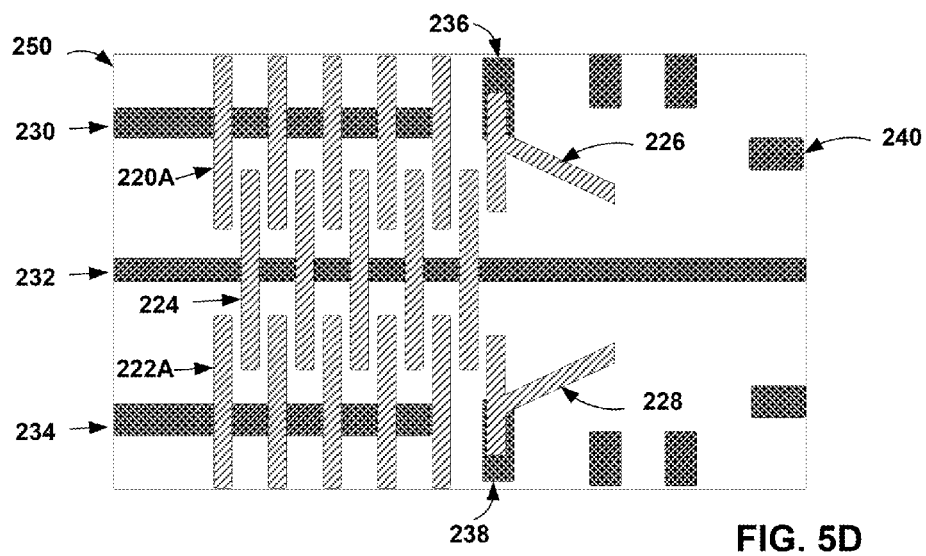
FIG. 5D is a diagram illustrating a leadframe with a perpendicular structure according to one or more techniques of this disclosure.

FIG. 5D is a diagram illustrating a leadframe with a perpendicular structure according to one or more techniques of this disclosure. Leadframe 250 combines the first and second layers depicted by FIGS. 5B and 5C. Parallel leads 230, 232 and 234 are substantially perpendicular to the conductive pads 220A, 222A and 224 at the location where the conductive pads electrically connect to the leads. For example, conductive pad 220A is substantially perpendicular to lead 230 at the location where conductive pad 220A connects to lead 230. As described above, lead 230 may be an input node for an integrated half-bridge circuit implemented by lateral conduction die 200 and connect the plurality of conductive pads connected to the drain electrode openings on lateral conduction die 200.

Leads 232 and 234, conductive pads 224, 222A, 226 and 228 perform the same functions as described in relation to FIGS. 5B and 5C. For clarity, not all conductive pads are numbered in FIG. 5D. Similarly leads 236, 238 and 240 and other non-numbered leads perform the same function as described above. The leads, such as 230, 232 and 234 may be a thick copper lead, or similar conductive material, on the leadframe and act as the current carrying path. The material, thickness and other dimensions of the leads may depend on the function of the circuit, and may be configured to reduce the current density and manage heat dissipation.

Figure 5E:
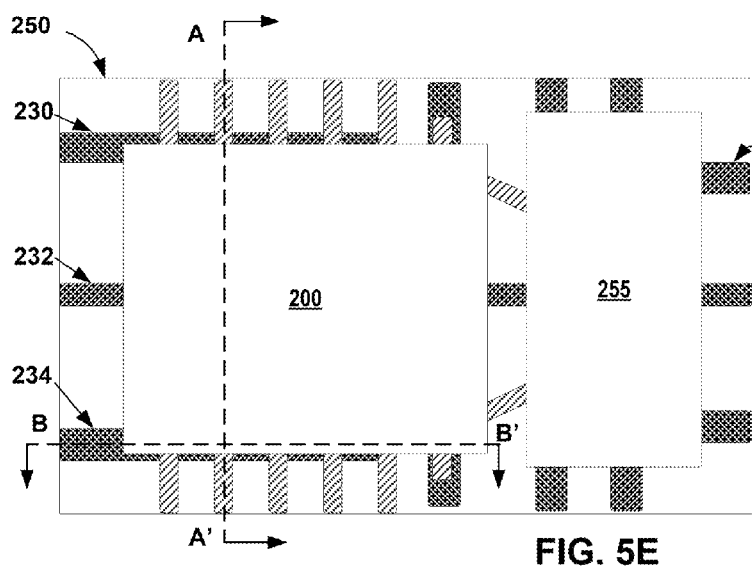
FIG. 5E is a top-view diagram of a leadframe and integrated lateral conduction die, along with a control IC, in accordance with some examples of this disclosure.

FIG. 5E is a top-view diagram of a leadframe and integrated lateral conduction die, along with a control IC, in accordance with some examples of this disclosure. FIG. 5E includes leadframe 250, as depicted in FIG. 5D and a top-view of lateral conduction die 200 described in relation to FIG. 5A. Leads 230, 232, 234 and 240 correspond to the same numbered leads described above in relation to FIGS. 5C and 5D.

FIG. 5E includes control IC 255. In some examples control IC 255 may be a driver circuit, or some similar circuit that controls the operation of a half-bridge circuit, such as that depicted by FIG. 3. In other examples, leadframe 250 and control IC 255 may be configured to support two discrete half-bridge circuits, rather than a single integrated half-bridge circuit. In other examples leadframe 250 may support other types of circuits, not limited to a half-bridge circuit.

Figure 5F:
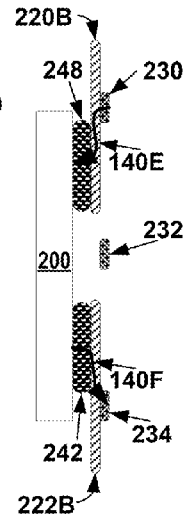
FIGS. 5F and 5G are side-view diagrams of a leadframe connected to a lateral conduction die, in accordance with some examples of this disclosure.

FIG. 5F is a side-view diagram of a lateral conduction die electrically connected to a leadframe, in accordance with some examples of this disclosure. Lateral conduction die 200 and leadframe 250 include the same or similar terminals and nodes as described with respect to FIGS. 5D-5E. FIG. 5F may correspond to the dashed line A-A' in FIG. 5E. FIG. 5F is similar to FIGS. 4F and 4H described above.

FIG. 5F depicts current 140E flowing from the input, lead 230, through conductive pad 220B to one of the plurality of drain electrode openings on lateral conduction die 200. Similar to FIGS. 4F and 4H above, electric current 140E may flow through electrical connection 248, where electrical connection 248 may be solder, conductive adhesive or similar connection.

At other times in the operation of the half-bridge circuit implemented by lateral conduction die 200, electric current 140F may flow from a source electrode opening of the plurality of source electrode openings on lateral conduction die 200. Electric current 140F may flow through electrical connection 242, conductive pad 222B and to lead 234. In some examples lead 234 may be connected to a reference or ground terminal of a larger circuit. At other times in the circuit operation, current may flow in or out of the half-bridge circuit output or SW terminal and therefore through lead 232.

Figure 5G:
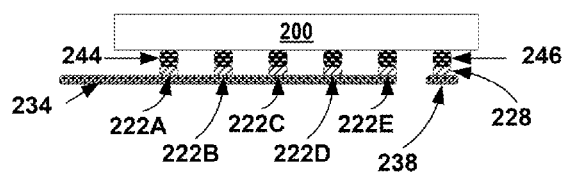

FIG. 5G is another side-view diagram of a lateral conduction die electrically connected to a leadframe, in accordance with some examples of this disclosure. Lateral conduction die 200 and leadframe 250 include the same or similar terminals and nodes as described with respect to FIGS. 5D-5E. FIG. 5G may correspond to the dashed line B-B' in FIG. 5E and is similar to FIG. 4G described above.

Lead 234 is substantially perpendicular to conductive pads 222A-222E at the locations where lead 234 electrically connects to conductive pads 222A-222E. Conductive pads 222A-222E are substantially parallel to the source electrode openings 212A-212E (not shown in FIG. 5G) on the die to reduce spreading resistance. Conductive pads 222A-222E electrically connect to the source electrode openings 212A-212E via electrical connections 244, not all of which are numbered.

Electrical connection 246 connects gate electrode opening G2 (204) to conductive pad 228 and lead 238. Conductive pad 228 may also connect to control IC 255, as shown in FIG. 5D, to control the operation of transistor 2 of lateral conduction die 200. Electrical connections 244 and 246 are similar to the electrical connections described in relation to FIG. 5F.

The arrangement of leadframe conductive pads and lead traces described in this disclosure may have advantages of lower PKG resistance along with a good thermal dissipation, when compared to conventional techniques. The perpendicular structure provides a short path for the current to travel from electrode pad openings on a lateral conduction die that are electrically connected to the conductive pads, and further to the lead, which carries current to other portions of a circuit. The techniques of this disclosure may have additional advantages by providing clearance and creepage distance that may be wide enough to handle mid to high voltage circuits. The shorter current path, compared to conventional techniques, may reduce the current density on the interface between the device and the package, which may therefore reduce the risk of electromigration.

Example 1. A conductive leadframe device for a lateral conduction die, wherein the lateral conduction die includes a plurality of parallel spaced and interleaved electrode openings on a surface of the die, the conductive leadframe device comprising: a first plane and a second plane, a plurality of parallel spaced and interleaved conductive pads on the first plane of the conductive leadframe, wherein a respective conductive pad of the plurality of conductive pads defines a major axis of the respective conductive pad. The leadframe also comprising a plurality of parallel conductors on the second plane of the conductive leadframe, wherein a respective conductor of the plurality of parallel conductors defines a major axis of the respective conductor, and wherein the major axis of the respective conductive pad is substantially orthogonal to the major axis of the respective conductor at a location where the respective conductive pad electrically connects to the respective conductor.

Example 2. The conductive leadframe device of example 1, wherein the plurality of parallel spaced and interleaved conductive pads is arranged in an interdigited pattern.

Example 3. The conductive leadframe device of any of examples 1-2 or any combination thereof, wherein the plurality of parallel spaced and interleaved conductive pads correspond to the plurality of parallel spaced and interleaved electrode openings on the surface of the lateral conduction die.

Example 4. The conductive leadframe device of any combination of examples 1-3, wherein the plurality of parallel spaced and interleaved electrode openings comprise a plurality of parallel spaced and interleaved source and drain electrode openings on the surface of the lateral conduction die and the plurality of parallel spaced and interleaved conductive pads correspond to the plurality of parallel spaced and interleaved source and drain electrode openings on the surface of the lateral conduction die.

Example 5. The conductive leadframe device of any combination of examples 1-4, wherein a size and a shape of a respective conductive pad of the plurality of parallel spaced and interleaved conductive pads is substantially the same as a size and shape of the respective electrode opening that corresponds to the respective conductive pad.

Example 6. The conductive leadframe device of any combination of examples 1-5, wherein a major axis of a first respective conductive pad is parallel and adjacent to a major axis of a second respective conductive pad, and the pitch distance between the major axis of a first respective conductive pad and the major axis of a second respective conductive pad is approximately 150 µm-400 µm.

Example 7. The conductive leadframe device of any combination of examples 1-6, wherein the pitch distance between the major axis of a first respective conductive pad and the major axis of a second respective conductive pad is less than the pitch distance between a first respective outer package pad and a second respective outer package pad.

Example 8. The conductive leadframe device of any combination of examples 1-7, wherein the respective conductive pad defines a length and a width of the respective conductive pad, the length of the respective conductive pad is longer than the width of the respective conductive pad, the major axis of the respective conductive pad is along the length of the conductive pad.

Example 9. The conductive leadframe device of any combination of examples 1-8, wherein the conductive leadframe further comprises a conductive segment on the first plane of the conductive leadframe wherein the conductive segment electrically connects a first respective conductive pad to at least a second respective conductive pad.

Example 10. The conductive leadframe device of any combination of examples 1-9, wherein a perpendicular structure between the conductive pads and the conductor at the location where the respective conductive pad electrically connects to the respective conductor, forms a wing shape.

Example 11. A device comprising: a lateral conduction die, wherein the lateral conduction die includes a plurality of parallel spaced and interleaved electrode openings on a surface of the die; and a conductive leadframe. The conductive leadframe comprises: a first plane and a second plane, a plurality of parallel spaced and interleaved conductive pads on the first plane of the conductive leadframe, wherein a respective conductive pad of the plurality of conductive pads defines a major axis of the respective conductive pad, and a plurality of parallel conductors on the second plane of the conductive leadframe, wherein a respective conductor of the plurality of parallel conductors defines a major axis of the respective conductor. The major axis of the respective conductive pad is substantially orthogonal to the major axis of the respective conductor at a location where the respective conductive pad electrically connects to the respective conductor.

Example 12. The device of example 11, wherein a respective conductive pad of the plurality of parallel spaced and interleaved conductive pads electrically connects to a respective electrode opening of the plurality of parallel spaced and interleaved electrode openings on the surface of the lateral conduction die.

Example 13. The device of any combination of examples 11-12, wherein the respective conductive pad electrically connects to the respective electrode opening by means of a conductive adhesive.

Example 14. The device of any combination of examples 11-13, wherein the lateral conduction die includes a plurality of transistors configured as a half bridge circuit.

Example 15. The device of any combination of examples 11-13, wherein the lateral conduction die is a first lateral conduction die, the device further comprising a second lateral conduction die, wherein: the first lateral conduction die is a first transistor and the second lateral conduction die is a second transistor, and the first transistor and the second transistor are configured to form a half bridge circuit.

Example 16. The device of any combination of examples 11-13, wherein the lateral conduction die comprises a gallium nitride (GaN) semiconductor die.

Example 17. The device of any combination of examples 11-13, wherein the lateral conduction die comprises one or more of a field effect transistor (FET), a high-electron-mobility transistor (HEMT), or an insulated gate bipolar transistor (IGBT).

Example 18. The device of any combination of examples 11-13, further comprising a control integrated circuit (IC), wherein a terminal of the control IC electrically connects to a first conductive pad of the plurality of parallel spaced and interleaved conductive pads.

Example 19. The device of any combination of examples 11-13, wherein wherein the terminal of the control IC is a first gate control terminal of the control IC and the first conductive pad is a first gate terminal of the lateral conduction die.

Example 20. A gallium nitride (GaN) semiconductor power device, the device comprising: a lateral conduction GaN semiconductor die, wherein the semiconductor die includes a plurality of parallel spaced and interleaved source and drain electrode openings on a surface of the semiconductor die; and a conductive leadframe. The conductive leadframe comprises: a first plane and a second plane; a plurality of parallel spaced and interleaved source and drain conductive pads on the first plane of the conductive leadframe, wherein a respective conductive pad of the plurality of conductive pads defines a major axis of the respective conductive pad, a plurality of parallel conductors on the second plane of the conductive leadframe, wherein a respective conductor of the plurality of parallel conductors defines a major axis of the respective conductor, and the major axis of the respective conductive pad is substantially orthogonal to the major axis of the respective conductor at a location where the respective conductive pad electrically connects to the respective conductor. And wherein: a respective conductive source pad of the plurality of parallel spaced and interleaved conductive source pads electrically connects to a respective source electrode opening of the plurality of parallel spaced and interleaved source electrode openings on the surface of the lateral conduction die, and a respective conductive drain pad of the plurality of parallel spaced and interleaved conductive drain pads electrically connects to a respective drain electrode opening of the plurality of parallel spaced and interleaved drain electrode openings on the surface of the lateral conduction die.

Various examples of the disclosure have been described. These and other examples are within the scope of the following claims.

The invention claimed is:

1. A conductive leadframe device comprising:
   a first plane of the leadframe device;
   a plurality of parallel spaced and interleaved pads on the first plane of the leadframe device, wherein a respective pad of the plurality of pads defines a major axis of the respective pad, a second plane of the leadframe device; and
a plurality of parallel conductors on the second plane of the leadframe device, wherein a respective conductor of the plurality of parallel conductors defines a major axis of the respective conductor,
wherein the major axis of each respective pad of the plurality of pads is on the first plane, and the major axis of each respective conductor of the plurality of conductors is on the second plane, and
wherein the major axis of the respective pad is substantially orthogonal to the major axis of the respective conductor at a location where the respective pad electrically connects to the respective conductor.

2. The conductive leadframe device of claim 1, wherein the plurality of parallel spaced and interleaved pads is arranged in an interdigited pattern.

3. The conductive leadframe device of claim 1, wherein the plurality of parallel spaced and interleaved pads correspond to a plurality of parallel spaced and interleaved electrode openings on the surface of a die.

4. The conductive leadframe device of claim 3 wherein the plurality of parallel spaced and interleaved electrode openings comprise a plurality of parallel spaced and interleaved source and drain electrode openings on the surface of the die and the plurality of parallel spaced and interleaved pads correspond to the plurality of parallel spaced and interleaved source and drain electrode openings on the surface of the die.

5. The conductive leadframe device of claim 3, wherein a size and a shape of a respective pad of the plurality of parallel spaced and interleaved pads is substantially the same as a size and shape of the respective electrode opening that corresponds to the respective pad.

6. The conductive leadframe device of claim 1, wherein
a major axis of a first respective pad is parallel and adjacent to a major axis of a second respective pad, and
the pitch distance between the major axis of a first respective pad and the major axis of a second respective pad is approximately 150 µm-400 µm.

7. The conductive leadframe device of claim 6, wherein the pitch distance between the major axis of a first respective pad and the major axis of a second respective pad is less than the pitch distance between a first respective outer package pad and a second respective outer package pad.

8. The conductive leadframe device of claim 1, wherein:
the respective pad defines a length and a width of the respective pad,
the length of the respective pad is longer than the width of the respective pad, and
the major axis of the respective pad is along the length of the pad.

9. The conductive leadframe device of claim 1, wherein the leadframe device further comprises a conductive segment on the first plane of the leadframe device wherein the conductive segment electrically connects a first respective pad to at least a second respective pad.

10. The conductive leadframe device of claim 1, wherein a perpendicular structure between the pads and the conductor at the location where the respective pad electrically connects to the respective conductor, forms a wing shape.

11. A device comprising:
a die, wherein the die includes a plurality of parallel spaced and interleaved electrode openings on a surface of the die; and
a conductive leadframe, the leadframe comprising:
a first plane of the leadframe;
a plurality of parallel spaced and interleaved pads on the first plane of the leadframe, wherein a respective pad of the plurality of pads defines a major axis of the respective pad,
a second plane of the leadframe; and
a plurality of parallel conductors on the second plane of the leadframe, wherein a respective conductor of the plurality of parallel conductors defines a major axis of the respective conductor,
wherein the major axis of each respective pad of the plurality of pads is on the first plane, and the major axis of each respective conductor of the plurality of conductors is on the second plane, and
wherein the major axis of the respective pad is substantially orthogonal to the major axis of the respective conductor at a location where the respective pad electrically connects to the respective conductor.

12. The device of claim 11, wherein a respective pad of the plurality of parallel spaced and interleaved pads electrically connects to a respective electrode opening of the plurality of parallel spaced and interleaved electrode openings on the surface of the die.

13. The device of claim 12, wherein the respective pad electrically connects to the respective electrode opening by means of a conductive adhesive.

14. The device of claim 11, wherein the die includes a plurality of transistors configured as a half bridge circuit.

15. The device of claim 11, wherein the die is a first die, the device further comprising a second die, wherein:
the first die is a first transistor and the second die is a second transistor, and
the first transistor and the second transistor are configured to form a half bridge circuit.

16. The device of claim 11, wherein the die comprises a gallium nitride (GaN) semiconductor die.

17. The device of claim 11, wherein the die comprises one or more of a field effect transistor (FET), a high-electron-mobility transistor (HEMT), or an insulated gate bipolar transistor (IGBT).

18. The device of claim 11, further comprising a control integrated circuit (IC), wherein a terminal of the control IC electrically connects to a first pad of the plurality of parallel spaced and interleaved pads.

19. The device of claim 18, wherein the terminal of the control IC is a first gate control terminal of the control IC and the first pad is a first gate terminal of the die.

20. A gallium nitride (GaN) semiconductor power device, the device comprising:
a GaN semiconductor die, wherein the semiconductor die includes a plurality of parallel spaced and interleaved source and drain electrode openings on a surface of the semiconductor die; and
a conductive leadframe comprising:
a first plane of the leadframe;
a plurality of parallel spaced and interleaved source pads and drain pads on the first plane of the leadframe, wherein a respective pad of the plurality of pads defines a major axis of the respective pad,
a second plane of the leadframe;
a plurality of parallel conductors on the second plane of the leadframe, wherein a respective conductor of the plurality of parallel conductors defines a major axis of the respective conductor,
wherein the major axis of each respective pad of the plurality of pads is on the first plane, and the major axis of each respective conductor of the plurality of conductors is on the second plane, and wherein the major axis of the respective pad is substantially orthogonal to the major axis of the respective conductor at a location where the respective pad electrically connects to the respective conductor; and wherein:
- a respective source pad of the plurality of parallel spaced and interleaved source pads electrically connects to a respective source electrode opening of the plurality of parallel spaced and interleaved source electrode openings on the surface of the die, and
- a respective drain pad of the plurality of parallel spaced and interleaved drain pads electrically connects to a respective drain electrode opening of the plurality of parallel spaced and interleaved drain electrode openings on the surface of the die.

* * * * *